(12) United States Patent
Takahashi

(10) Patent No.: US 8,513,993 B2
(45) Date of Patent: Aug. 20, 2013

(54) DLL CIRCUIT AND SEMICONDUCTOR DEVICE HAVING THE DLL CIRCUIT

(75) Inventor: Hiroki Takahashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 565 days.

(21) Appl. No.: 12/801,596

(22) Filed: Jun. 16, 2010

(65) Prior Publication Data

US 2010/0327926 A1 Dec. 30, 2010

(30) Foreign Application Priority Data

Jun. 24, 2009 (JP) .................................. 2009-149751

(51) Int. Cl.
*H03L 7/06* (2006.01)
(52) U.S. Cl.
USPC .......................................................... 327/158
(58) Field of Classification Search
None
See application file for complete search history.

(56) References Cited

U.S. PATENT DOCUMENTS

| | | | | |
|---|---|---|---|---|
| 6,917,229 B2 * | 7/2005 | Cho | ............................... | 327/158 |
| 7,598,783 B2 * | 10/2009 | Shin et al. | ...................... | 327/158 |
| 2004/0091075 A1 * | 5/2004 | Bhullar et al. | ................. | 375/375 |
| 2008/0218227 A1 | 9/2008 | Maeda | | |

FOREIGN PATENT DOCUMENTS

JP 2008-217947 A 9/2008

* cited by examiner

*Primary Examiner* — Daniel Rojas
(74) *Attorney, Agent, or Firm* — McGinn IP Law Group, PLLC

(57) ABSTRACT

To include a phase-difference-amount detecting circuit that detects an amount of phase difference between an external clock signal and a replica clock signal, a variable delay circuit that delays the external clock signal based on the amount of phase difference to generate an internal clock signal, and a replica buffer that delays the internal clock signal to generate the replica clock signal. According to the present invention, the variable delay circuit is controlled based on the amount of phase difference, instead of being controlled based on whether the phase of the replica clock signal is advanced or delayed with respect to the external clock signal. Accordingly, even when the amount of phase difference is large, a DLL circuit can be locked at a high speed.

20 Claims, 18 Drawing Sheets

DLL CIRCUIT AND SEMICONDUCTOR DEVICE HAVING THE DLL CIRCUIT

BACKGROUND OF THE INVENTION

1. Field of the Invention

The present invention relates to a DLL (Delay Locked Loop) circuit and a semiconductor device having the DLL circuit incorporated therein, and more particularly relates to a DLL circuit with a reduced time required for locking and a semiconductor device having the DLL circuit incorporated therein.

2. Description of Related Art

In recent years, a synchronous memory that operates in synchronization with a clock signal has been widely used as a main memory for personal computers. To set inputted/outputted data precisely in synchronization with an external clock signal especially in a DDR (Double Data Rate) synchronous memory, a DLL circuit that generates an internal clock signal in synchronization with an external clock signal is used (see Japanese Patent Application Laid-open No. 2008-217947).

The DLL circuit detects whether a replica clock signal is advanced or delayed with respect to an external clock signal and adjusts the amount of delay of a variable delay circuit based on a result of detection, so that their phases match each other.

However, because the amount of delay is adjusted by one pitch at a time in conventional DLL circuits, when the amount of phase difference between an external clock signal and a replica clock signal, that is, the time difference between an active edge of the external clock signal and an active edge of the replica clock signal is large, the number of adjusting operations is increased, and thus there is a problem that a time required for locking the DLL circuit is extended.

SUMMARY

In one embodiment, there is provided a DLL circuit that includes a phase-difference-amount detecting circuit that outputs a variable value indicating an amount of phase difference between a first clock signal and a second clock signal, a variable delay circuit that delays the first clock signal based on the variable value to generate a third clock signal and a replica buffer that generates the second clock signal based on the third clock signal.

In another embodiment, there is provided a semiconductor device comprising the DLL circuit as described above and an output buffer, wherein the first clock signal is supplied from outside of the semiconductor device, and the output buffer outputs data to outside of the semiconductor device in synchronization with the third clock signal.

According to the present invention, a variable delay circuit is controlled based on its amount of phase difference, instead of being controlled based on whether the phase of a replica clock signal is advanced or delayed with respect to an external clock signal.

Accordingly, even when the amount of phase difference is large, the DLL circuit can be locked at a high speed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
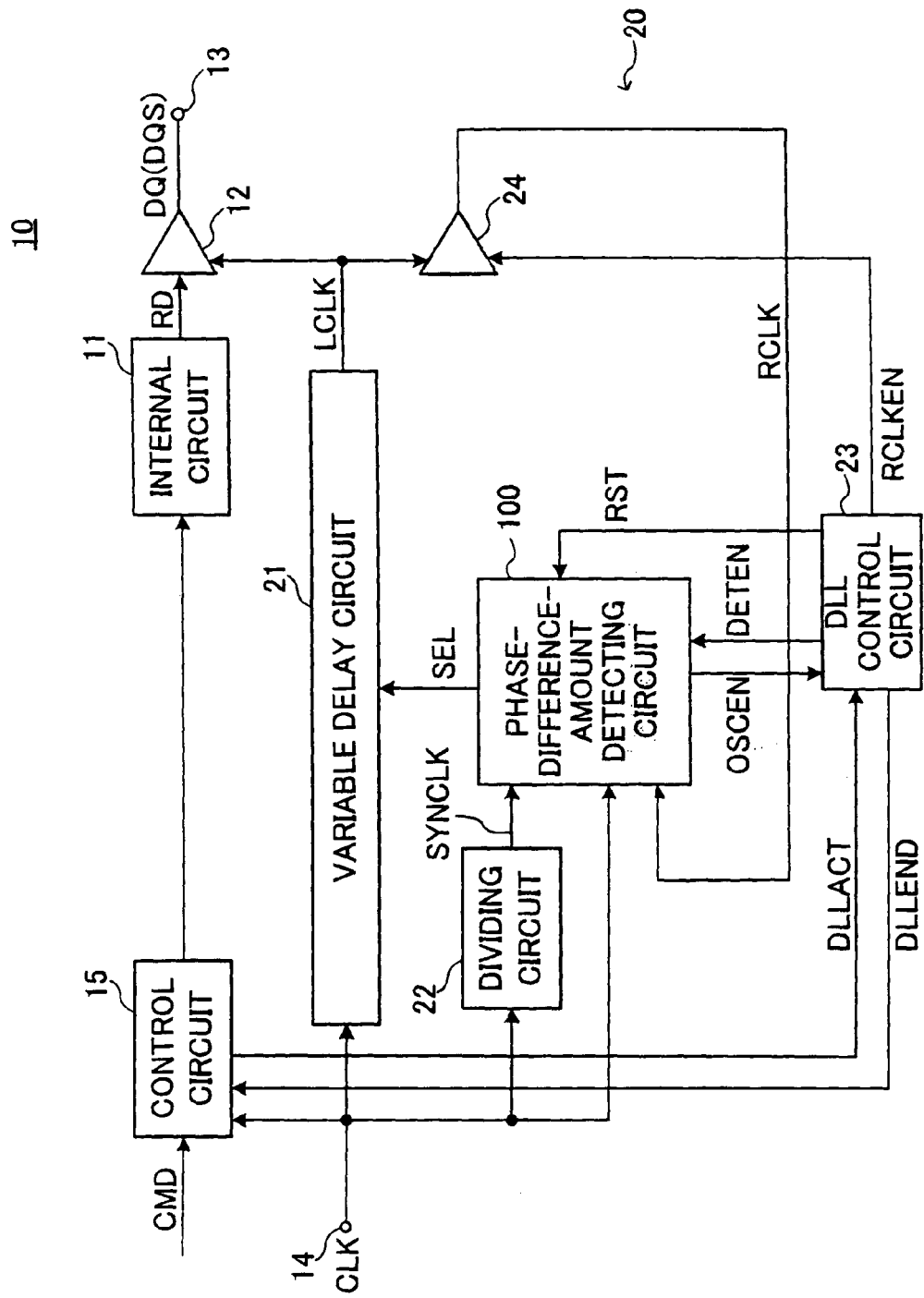
FIG. 1 is a block diagram showing a configuration of a semiconductor device according to a first embodiment of the present invention.

FIG. 1 is a block diagram showing a configuration of a semiconductor device 10 according to a first embodiment of the present invention.

As shown in FIG. 1, the semiconductor device 10 according to the first embodiment includes an internal circuit 11 that outputs an internal output signal RD, an output buffer 12 that outputs an external output signal DQ (or a strobe signal DQS) based on the internal output signal RD, a DLL circuit 20 that controls an operation timing of the output buffer 12, and a control circuit 15 that controls the DLL circuit 20 and the internal circuit 11. The configuration of the internal circuits 11 depends on the type of the semiconductor device 10. For example, when the semiconductor device 10 according to the first embodiment is a DRAM (Dynamic Random Access Memory), the internal circuit 11 may include a memory cell array, a column switch, a read amplifier and the like.

The output buffer 12 externally outputs the external output signal DQ (or the strobe signal DQS) via an output terminal 13. A timing of outputting the external output signal DQ (or the strobe signal DQS) must be in synchronization with an external clock signal CLK (a first clock signal) inputted via a clock terminal 14. The operation timing of the output buffer 12 is controlled by the DLL circuit 20. A configuration of the DLL circuit 20 is explained below.

As shown in FIG. 1, the DLL circuit 20 includes a variable delay circuit 21, a dividing circuit 22, a DLL control circuit 23, a replica buffer 24, and a phase-difference-amount detecting circuit 100.

The variable delay circuit 21 delays the external clock signal CLK to generate an internal clock signal LCLK (a third clock signal). A specific configuration of the variable delay circuit 21 is explained later.

As shown in FIG. 1, the internal clock signal LCLK is supplied to the output buffer 12 and the replica buffer 24. The output buffer 12 is, as described above, receives the internal output signal RD supplied by the internal circuit 11 and supplies the internal output signal RD to the output terminal 13 as the external output signal DQ (or the strobe signal DQS). The replica buffer 24 has substantially the same circuit configuration as that of the output buffer 12, and outputs a replica clock signal RCLK (a second clock signal) in synchronization with the internal clock signal LCLK. A phase of the replica clock signal RCLK thus matches precisely with that of the external output signal DQ (or the strobe signal DQS). The size of a transistor in the replica buffer 24 does not need to be the same as that of a transistor in the output buffer 12. As long as their impedances are substantially the same, a shrunk transistor can be used.

The dividing circuit 22 divides the external clock signal CLK to generate a sampling clock signal SYNCLK. The sampling clock signal SYNCLK is supplied to the phase-difference-amount detecting circuit 100 and used as a synchronization signal indicating a timing of varying the amount of delay of the variable delay circuit 21. The dividing circuit 22 is used because a certain time is required for a detecting operation performed by the phase-difference-amount detecting circuit 100. Another reason for using the dividing circuit 22 is that, when the amount of delay of the variable delay circuit 21 is changed highly frequently more than necessary, the power consumption increases significantly. The number of divisions of the dividing circuit 22 is preferably set to about eight, although it is not particularly limited thereto.

The DLL control circuit 23 controls the phase-difference-amount detecting circuit 100 and the replica buffer 24 and is operated based on commands from the control circuit 15. Specifically, when a DLL start signal DLLACT from the control circuit 15 is activated, a reset signal RST, an enable signal DETEN, and a replica buffer control signal RCLKEN are generated and the DLL circuit 20 thus starts a phase adjusting operation by these signals. When a DLL end signal DLLEND from the control circuit 15 is activated, the DLL circuit 20 is stopped and the semiconductor device 10 is set in an asynchronous mode. The operation of the control circuit 15 is determined by an external command CMD. The external command CMD also controls the internal circuit 11. The control circuit 15 is operated in synchronization with the external clock signal CLK.

The phase-difference-amount detecting circuit 100 detects the amount of phase difference between the external clock signal CLK and the replica clock signal RCLK, and a select signal SEL indicating a result of detection is supplied to the variable delay circuit 21. "The amount of phase difference" indicates a time when the replica clock signal RCLK is advanced or delayed with respect to the external clock signal CLK. Accordingly, the amount of delay of the variable delay circuit 21 is controlled based on the time when the replica clock signal RCLK is advanced or delayed with respect to the external clock signal CLK. The configuration of the DLL circuit 20 is explained below in more detail by focusing on the phase-difference-amount detecting circuit 100.

Figure 2:
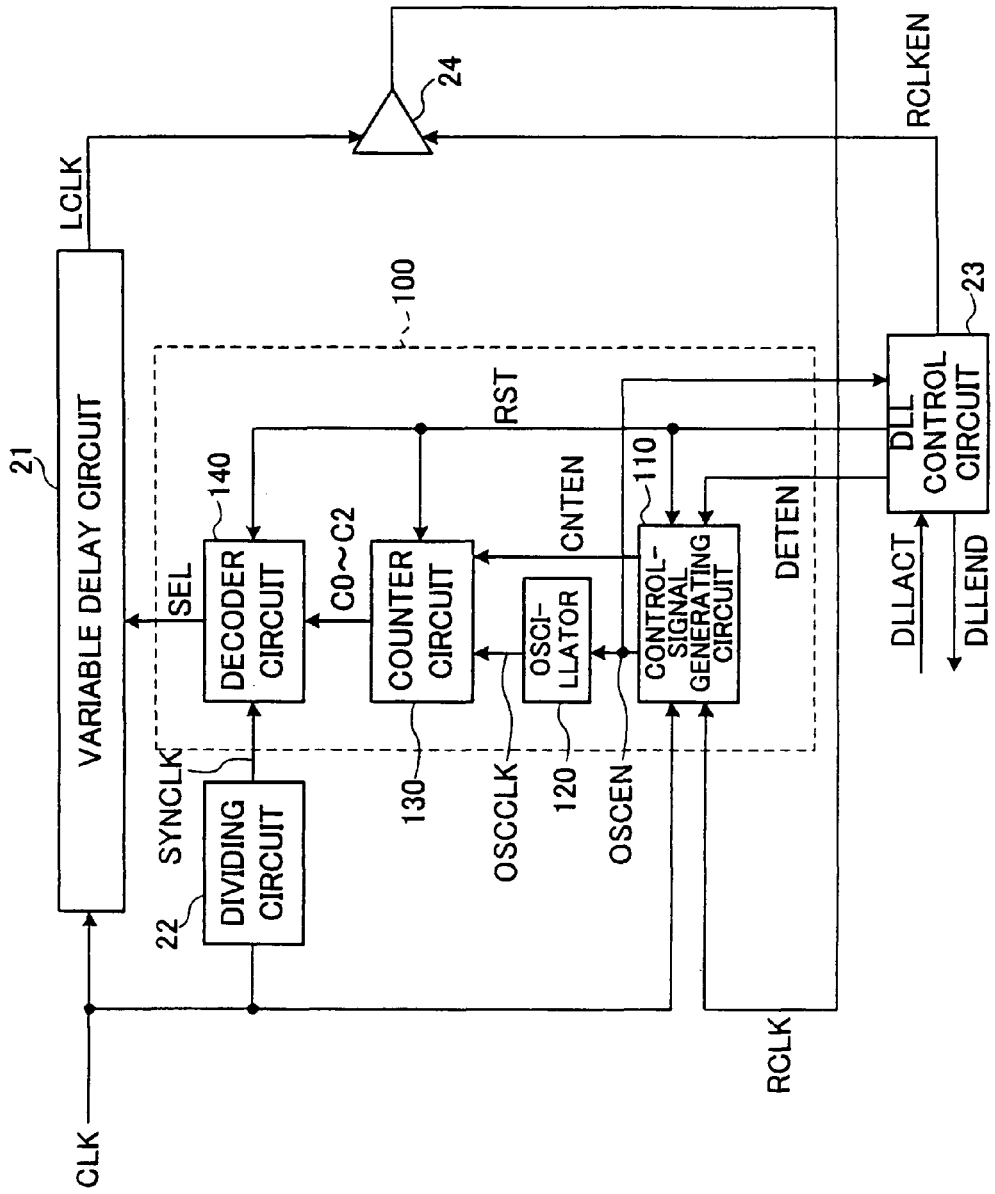
FIG. 2 is a further detailed block diagram of the DLL circuit.

FIG. 2 is a further detailed block diagram of the DLL circuit 20 and shows an internal configuration of the phase-difference-amount detecting circuit 100 more specifically.

As shown in FIG. 2, the phase-difference-amount detecting circuit 100 includes a control-signal generating circuit 110, an oscillator 120, a counter circuit 130, and a decoder circuit 140. Specific configurations of the respective circuits constituting the phase-difference-amount detecting circuit 100 are explained below.

Figure 3:
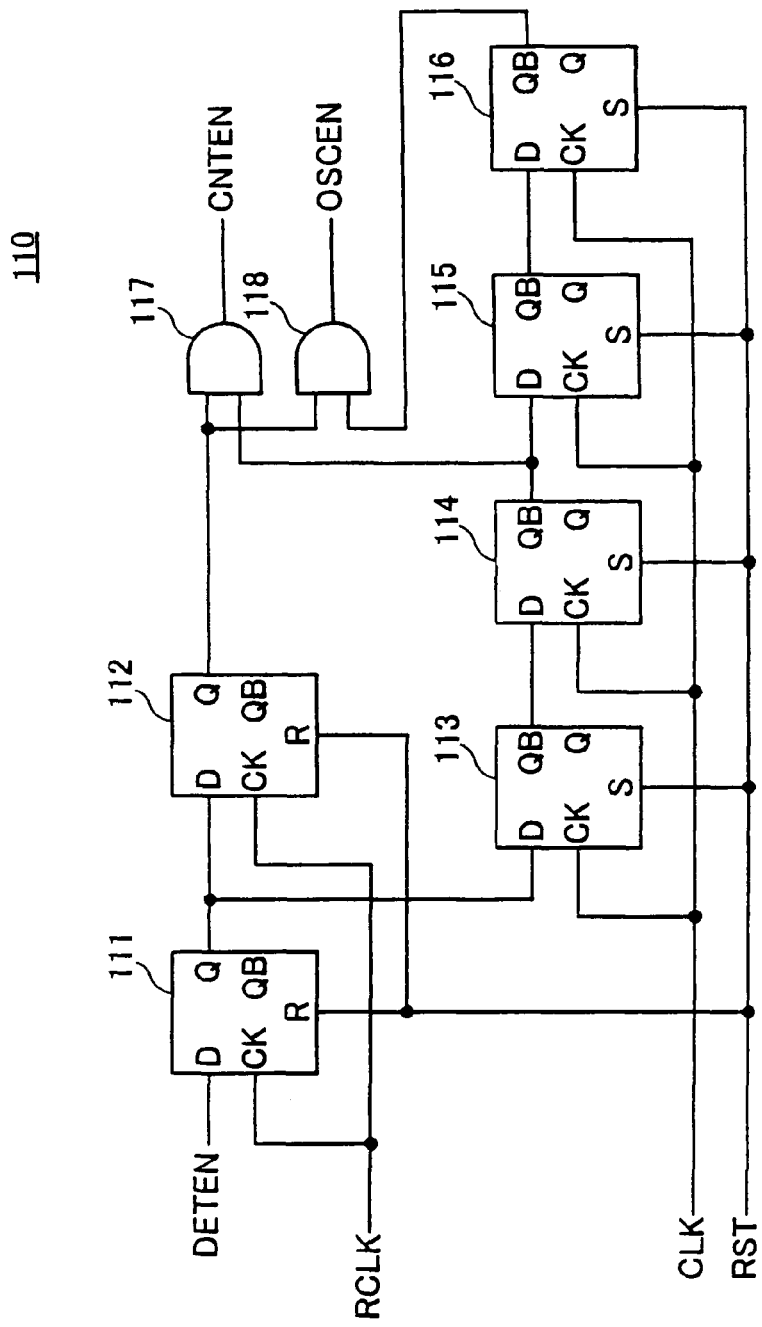
FIG. 3 is a circuit diagram of the control-signal generating circuit.

FIG. 3 is a circuit diagram of the control-signal generating circuit 110.

As shown in FIG. 3, the control-signal generating circuit 110 is constituted by data latch circuits 111 to 116 and 2-input AND gates 117 and 118. Among the data latch circuits 111 to 116, the data latch circuits 111 and 112 are cascade-connected to each other and perform a latch operation in synchronization with the replica clock signal RCLK. The enable signal DETEN is inputted to a data input terminal D of the data latch circuit 111 in a first stage. An input signal to the AND gates 117 and 118 is outputted from a data output terminal Q of the data latch circuit 112 in a final stage. The data latch circuits 111 and 112 have a reset input terminal R. The reset signal RST is supplied to the reset input terminal R.

Among the data latch circuits 111 to 116, the data latch circuits 113 to 116 are also cascade-connected to each other and perform the latch operation in synchronization with the external clock signal CLK. An output of the data latch circuit 111 is supplied to a data input terminal D of the data latch circuit 113 in a first stage. An input signal to the AND gate 117 is outputted from a data output terminal QB of the data latch circuit 114 in a second stage. An input signal to the AND gate 118 is outputted from a data output terminal Q of the data latch circuit 116 in the final stage. The data latch circuits 113 to 116 have a set input terminal S. The reset signal RST is supplied to the set input terminal S.

With this configuration, when the enable signal DETEN is changed to a high level after the reset signal RST is activated, outputs of the AND gates 117 and 118 are changed to a high level in response to a second rising edge of the replica clock signal RCLK. The output of the AND gate 117 is used as a counter control signal CNTEN and supplied to the counter circuit 130. The output of the AND gate 118 is used as an oscillator control signal OSCEN and supplied to the oscillator 120.

When the enable signal DETEN is changed to a low level after the reset signal RST is activated, the replica clock signal RCLK rises once and then the output of the AND gate 117 is changed to a low level in response to a second rising edge of the external clock signal CLK and the output of the AND gate 118 is changed to a low level in response to a fourth rising edge of the external clock signal CLK.

In this manner, the counter control signal CNTEN and the oscillator control signal OSCEN are changed to a high level in synchronization with the replica clock signal RCLK and to a low level in synchronization with the external clock signal CLK.

Figure 4:
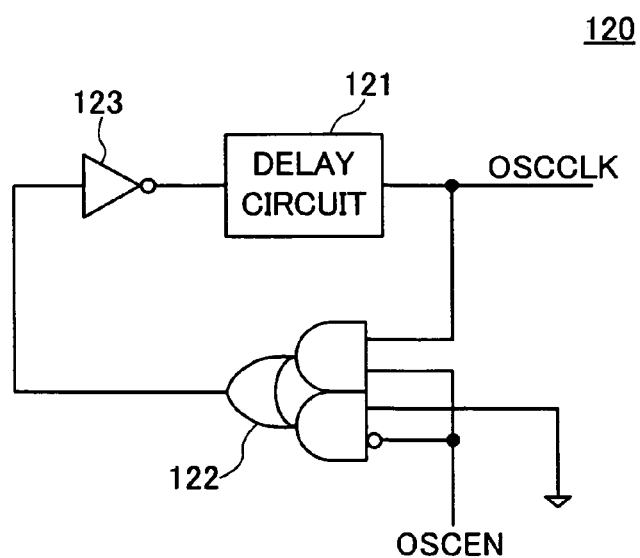
FIG. 4 is a circuit diagram of the oscillator.

FIG. 4 is a circuit diagram of the oscillator 120.

As shown in FIG. 4, the oscillator 120 is configured such that a delay circuit 121 is loop-connected to a composite gate 122 via an inverter 123. The oscillator control signal OSCEN is inputted to the composite gate 122. When the oscillator control signal OSCEN becomes a high level, an output of the delay circuit 121 is passed. Because the oscillator 120 thus configures an unstable multi-vibrator, an oscillator clock signal OSCCLK serving as an output of the oscillator 120 is oscillated at a period determined by the amount of delay of the delay circuit 121, the composite gate 122, and the inverter 123. When the oscillator control signal OSCEN is a low level, the output of the composite gate 122 is held at a low level and thus the oscillation of the oscillator clock signal OSCCLK is stopped. The amount of delay of the delay circuit 121 is designed such that a frequency of the oscillator clock signal OSCCLK is sufficiently higher than that of the external clock signal CLK.

Figure 5A:
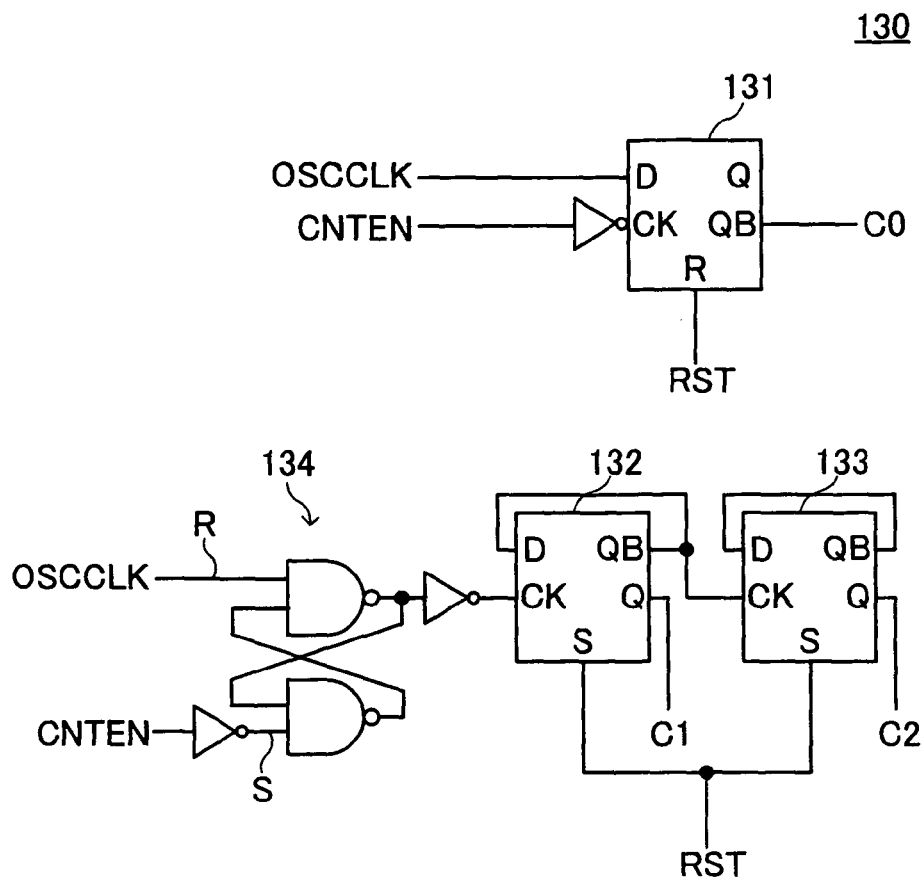
FIG. 5A is a circuit diagram of the counter circuit.
Figure 5B:
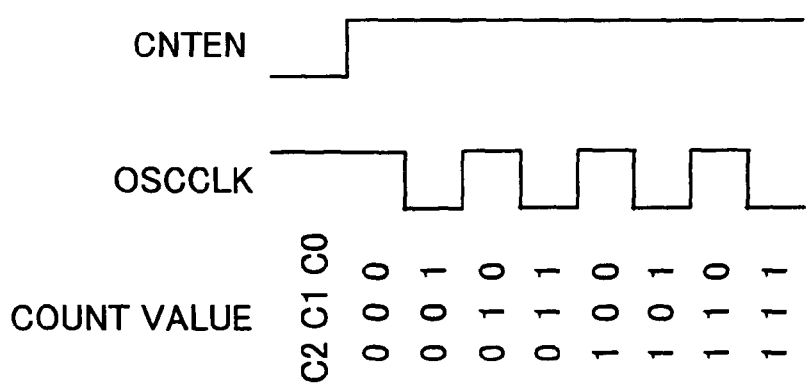
FIG. 5B is a waveform diagram showing an operation of the counter circuit.

FIG. 5A is a circuit diagram of the counter circuit 130, and FIG. 5B is a waveform diagram showing an operation of the counter circuit 130.

As shown in FIG. 5A, the counter circuit 130 includes three data latch circuits 131 to 133. These data latch circuits 131 to 133 have a reset input terminal R to which the reset signal RST is supplied. The oscillator clock signal OSCCLK is supplied to a data input terminal D of the data latch circuit 131 and an inverted counter control signal CNTEN is supplied to a clock input terminal CK. A least significant bit C0 of a count value is outputted from an inverted output terminal QB of the data latch circuit 131.

Meanwhile, the data latch circuits 132 and 133 constitute a binary counter and output bits C1 and C2, respectively. The bit C1 is a lower second bit of the count value and the bit C2 is a most significant bit of the count value. An output of an SR latch circuit 134 is supplied to a clock input terminal CK of the data latch circuit 132. The oscillator clock signal OSCCLK is supplied to a reset input terminal R of the SR latch circuit 134. The inverted counter control signal CNTEN is supplied to a set input terminal S.

With this configuration, when the counter control signal CNTEN becomes a high level, the count values C2 to C0 serving as outputs of the counter circuit 130 are incremented in response to both a falling edge and a rising edge of the oscillator clock signal OSCCLK, as shown in FIG. 5B. That is, the count value is incremented every half period of the oscillator clock signal OSCCLK. Because the count values C2 to C0 are three bits in the first embodiment, the count value is 0 to 7 in a decimal number.

Figure 6:
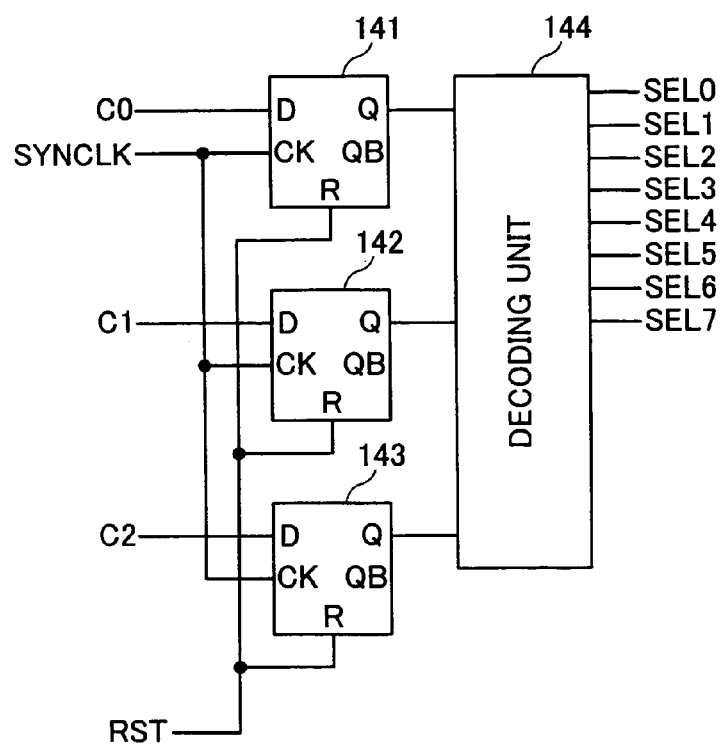
FIG. 6 is a circuit diagram of the decoder circuit.

FIG. 6 is a circuit diagram of the decoder circuit 140.

As shown in FIG. 6, the decoder circuit 140 includes three data latch circuits 141 to 143 and a decoding unit 144 decoding a 3-bit count value. The corresponding bits C0, C1, and C2 of the count value are inputted to respective data input terminals D of the data latch circuits 141 to 143. The sampling clock signal SYNCLK is inputted to clock input terminals CK of the data latch circuits 141 to 143. The reset signal RST is inputted to the respective reset input terminals R.

With this configuration, the count values C2 to C0 are latched in synchronization with the sampling clock signal SYNCLK and the latched count values are decoded by the decoding unit 144. Any one of eight select signals SEL0 to SEL7 serving as an output of the decoding unit 144 is activated.

The specific configuration of the phase-difference-amount detecting circuit 100 is as described above. The generated select signal SEL (SEL0 to SEL7) is supplied to the variable delay circuit 21 shown in FIGS. 1 and 2.

Figure 7:
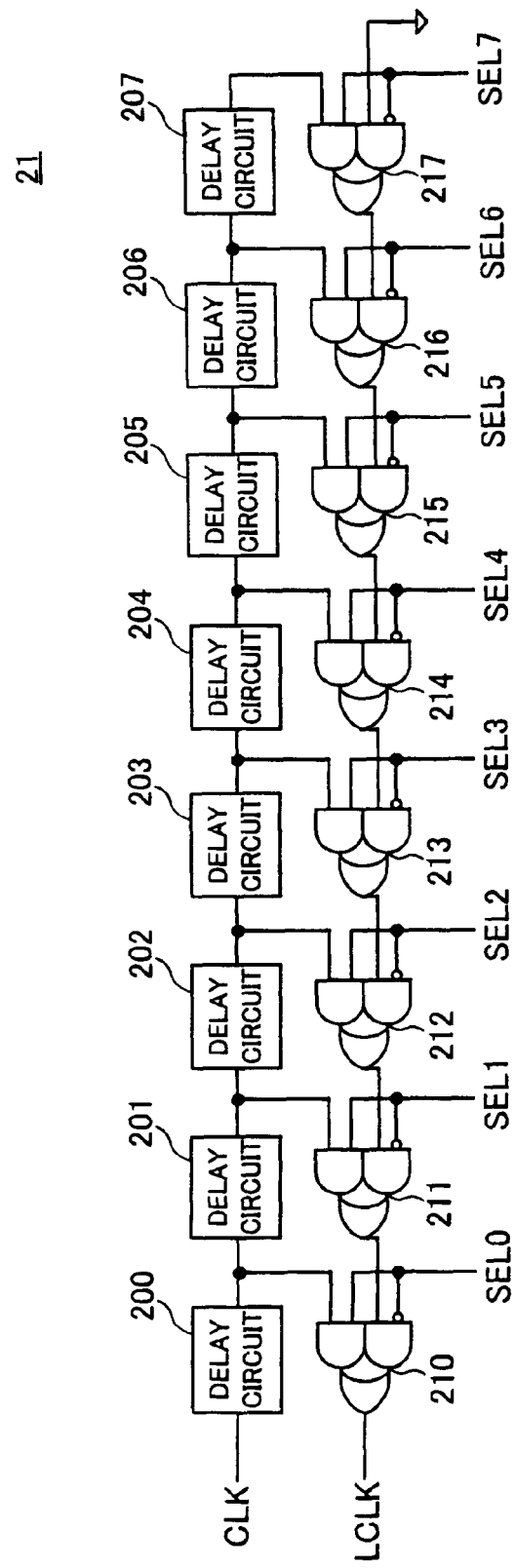
FIG. 7 is a circuit diagram of the variable delay circuit.

FIG. 7 is a circuit diagram of the variable delay circuit 21.

As shown in FIG. 7, the variable delay circuit 21 is constituted by eight cascade-connected delay circuits 200 to 207 and corresponding composite gates 210 to 217. The external clock signal CLK is inputted to the delay circuits 200 to 207 and thus delayed by one pitch every time passing though each delay circuit. Delayed external clock signals CLK are inputted to the corresponding composite gates 210 to 217. The corresponding select signals SEL0 to SEL7 are inputted to the composite gates 210 to 217. An output of a composite gate that a corresponding one of the select signals SEL0 to SEL7 is activated matches an output of corresponding one of the delay circuits 200 to 207. Outputs of other composite gates are passed.

Thus, the phase of the internal clock signal LCLK to be outputted finally is determined based on an activated one of the select signals SEL0 to SEL7. According to this example, when the select signal SEL0 is activated, the phase difference between the external clock signal CLK and the internal clock signal LCLK is minimized. When the select signal SEL7 is activated, the phase difference between the external clock signal CLK and the internal clock signal LCLK is maximized.

The amount of one-stage delay of the delay circuits 200 to 207 is designed so as to match the amount of delay of the delay circuit 121 included in the oscillator 120. The amount of delay of the composite gates 210 to 217 is designed so as to match the amount of delay of the composite gate 122 included in the oscillator 120. Accordingly, when the amount of delay of the inverter 123 is relatively and sufficiently small, the adjustment pitch of the variable delay circuit 21 matches a half period of the oscillator clock signal OSCCLK. More specifically, when the select signal SELn (n=0 to 7) is selected, the amount of delay of the variable delay circuit 21 is represented by $A \times (n+1)$ wherein A indicates a half period of the oscillator clock signal OSCCLK.

The configuration of the DLL circuit 20 according to the first embodiment is as described above. An operation of the DLL circuit 20 is described next.

Figure 8:
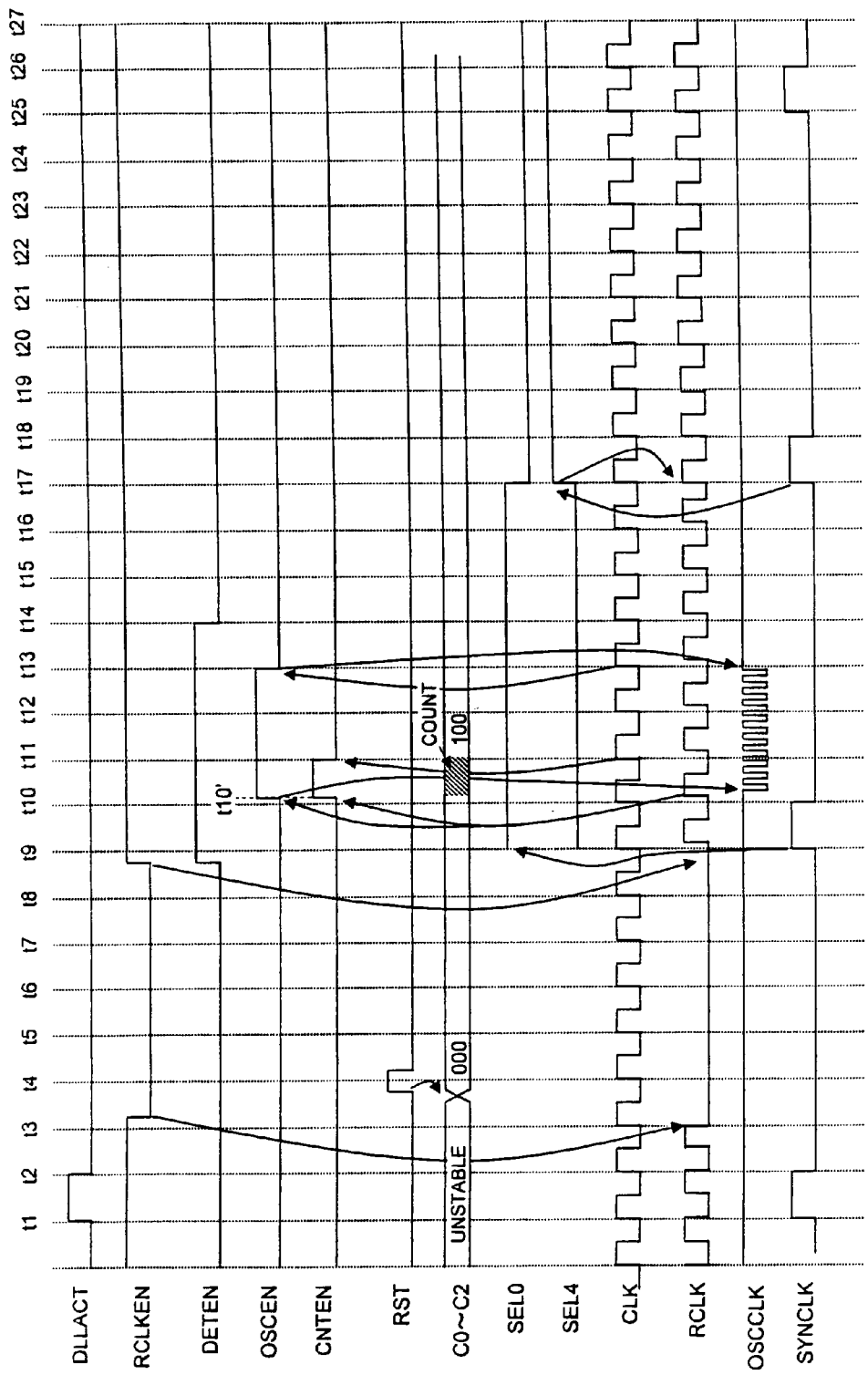
FIG. 8 is a timing diagram for explaining the operation of the DLL circuit.

FIG. 8 is a timing diagram for explaining the operation of the DLL circuit 20.

As shown in FIG. 8, when the DLL start signal DLLACT is activated from a time t1 to a time t2, the DLL control circuit 23 responds to the signal to inactivate the replica buffer control signal RCLKEN for a fixed period and generate a one-shot reset signal RST. The operation of the replica buffer 24 is thus suspended for a fixed period and the phase-difference-amount detecting circuit 100 is reset. In the example shown in FIG. 8, the replica buffer control signal RCLKEN is inactivated from immediately after a time t3 to immediately before a time t9 and the reset signal RST is activated around a time t4. When the phase-difference-amount detecting circuit 100 is reset, the count value of the counter circuit 130 is initialized to 000 (a binary number).

The DLL control circuit 23 then activates the enable signal DETEN simultaneously with the activation of the replica buffer control signal RCLKEN and maintains the activation of the enable signal DETEN for a fixed period. In the example shown in FIG. 8, the enable signal DETEN is activated from immediately before the time t9 to a time t14. The activation of the enable signal DETEN starts the operation of the control-signal generating circuit 110 shown in FIG. 3 and the counter control signal CNTEN and the oscillator control signal OSCEN are generated.

Specifically, the counter control signal CNTEN and the oscillator control signal OSCEN are activated at the same time in response to a rising edge t10' of the replica clock signal RCLK corresponding to a time t10 and inactivated in synchronization with times t11 and t13, respectively. The time t10' corresponds to the second rising edge of the replica clock signal RCLK after the enable signal DETEN is changed to a high level. The times t11 and t13 correspond respectively to the second rising edge and the fourth rising edge of the external clock signal CLK after the enable signal DETEN is changed to a high level. Such operations are as described above with reference to FIG. 3.

The oscillator 120 thus starts to oscillate at the time t10', and at the same time, the counter circuit 130 starts to count the oscillator clock signal OSCCLK. The counting operation of the counter circuit 130 ends at the time t11. That is, the counter circuit 130 counts the oscillator clock signal OSC-CLK from the time t10' to the time t11.

The time t10' is defined by the rising edge of the replica clock signal RCLK. The time t11 is defined by the rising edge of the external clock signal CLK. Consequently, the count value of the counter circuit 130 indicates the amount of phase difference between the external clock signal CLK and the replica clock signal RCLK. The count value is 100 (a binary number) in the example shown in FIG. 8 and this is the amount of phase difference detected. This means that when a half period of the oscillator clock signal OSCCLK is indicated by A, the amount of phase difference is 4A to 5A.

This count value (100) is fetched in the decoder circuit 140 in synchronization with the sampling clock signal SYNCLK and decoded. The select signal SEL4 corresponding to the count value=100 is thus activated and the composite gate 214 included in the variable delay circuit 21 is selected. The amount of delay of the variable delay circuit 21 is set to the amount of delay (=5A) determined by the five delay circuits 200 to 204 and the five composite gates 210 to 214.

The phase adjusting operation of the internal clock signal LCLK is completed as described above. In this manner, according to the first embodiment, the amount of delay is varied by one or more pitches at a time based on the amount of phase difference. The phase adjustment of the internal clock signal LCLK is thus always completed by one phase adjusting operation. The DLL circuit 20 can thus be locked at a higher speed as compared to conventional cases.

Figure 9:
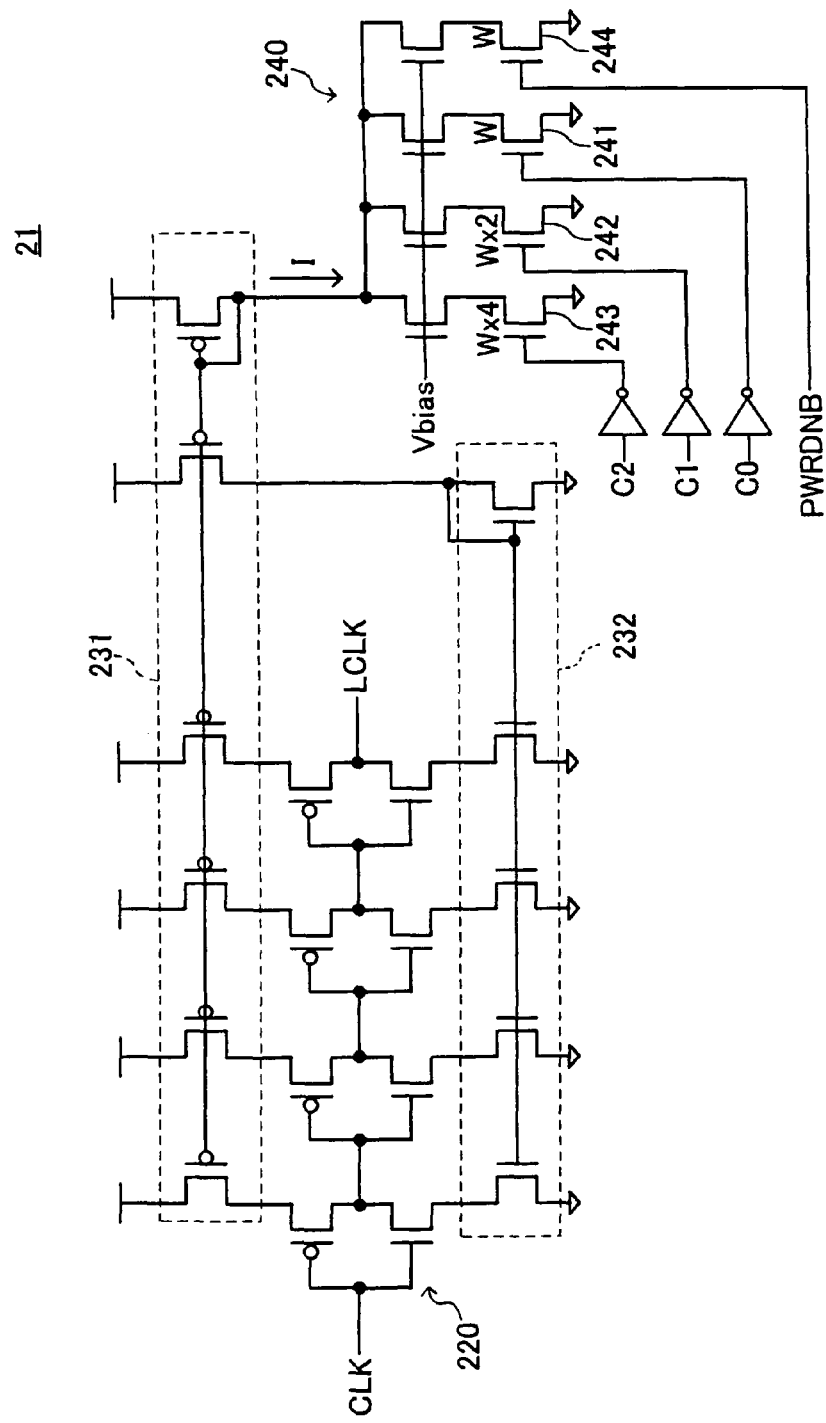
FIG. 9 is a circuit diagram of a variable delay circuit according to a modification.

FIG. 9 is a circuit diagram of a variable delay circuit 21 according to a modification.

The variable delay circuit 21 shown in FIG. 9 includes an inverter string 220 constituted by a plurality of stages (four stages in this example) of inverters, a constant current circuit 231 that applies an operating current to a source of a P-channel MOS transistor constituting the inverter string 220, a constant current circuit 232 that applies an operating current to a source of an N-channel MOS transistor constituting the inverter string 220, and a current adjustment circuit 240 that determines a current value I of the constant current circuits 231 and 232.

The current adjustment circuit 240 includes four select transistors 241 to 244 connected in parallel to each other. Current supply capabilities of the select transistors 241 to 244 are weighted. When the channel width of the select transistors 241 and 244 is indicated by W as shown in FIG. 9, the channel width of the select transistor 242 is designed to be W×2. The channel width of the select transistor 243 is designed to be W×4. Inverted signals of count values C0, C1, and C2 of the counter circuit 130 are supplied to gates of the select transistors 241 to 243. Any of eight current values is thus selected based on a 3-bit count value.

The select transistor 244 applies a minimum current when all the select transistors 241 to 243 are switched off (count value=111). In a state that the DLL is switched on, the select transistor 244 is always switched on because a power down signal PWRDNB=H. When the DLL enters a power down mode, the power down signal PWRDNB becomes L and the select transistor 244 is thus switched off. Accordingly, the current value becomes zero.

A current I generated by the current adjustment circuit 240 based on the count value is duplicated by current mirror circuits included in the constant current circuits 231 and 232 and applied to the inverter string 220 as the operating current. Because the delay of the inverter string 220 depends on the operating current, the phase of the internal clock signal LCLK can be controlled by the count value.

Figure 10A:
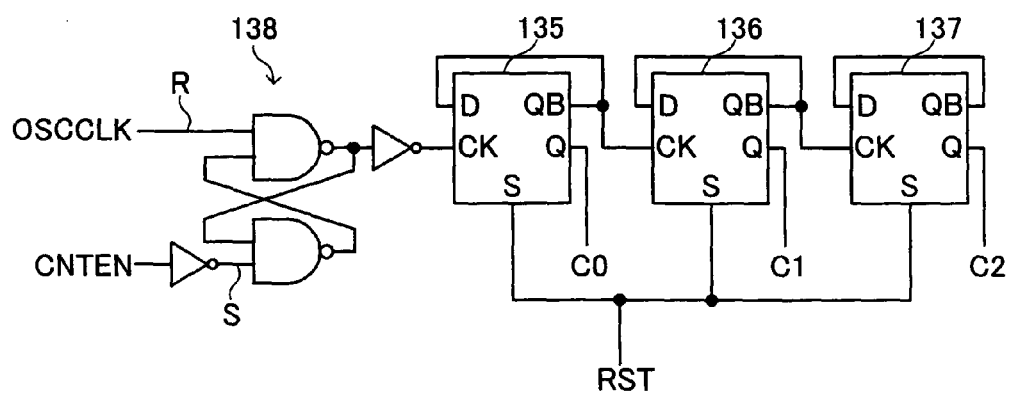
FIG. 10A is a circuit diagram of the counter circuit of the modification.
Figure 10B:
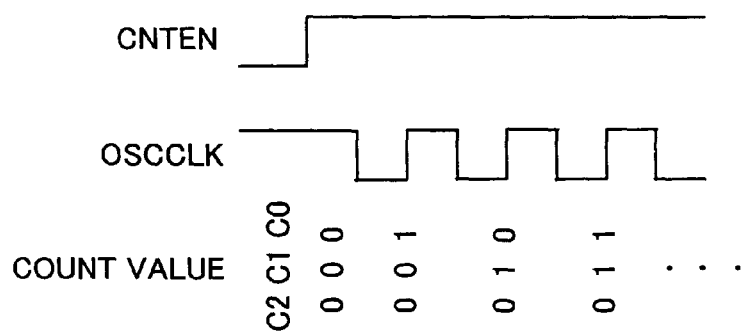
FIG. 10B is a waveform diagram showing an operation of the counter circuit according to the modification.

FIG. 10A is a circuit diagram of the counter circuit 130 of the modification, and FIG. 10B is a waveform diagram showing an operation of the counter circuit 130 according to the modification.

The counter circuit 130 shown in FIG. 10A includes three data latch circuits 135 to 137. These data latch circuits 135 to 137 constitute a 3-bit binary counter and output bits C0, C1, and C2, respectively. These data latch circuits 135 to 137 have a reset input terminal R to which the reset signal RST is supplied. An output of the SR latch circuit 138 is supplied to a clock input terminal CK of the data latch circuit 135. The oscillator clock signal OSCCLK is supplied to a reset input terminal R of the SR latch circuit 138. An inverted counter control signal CNTEN is supplied to a set input terminal S.

With this configuration, when the counter control signal CNTEN becomes a high level, the count values C2 to C0 serving as outputs of the counter circuit 130 are incremented in response to the rising edge of the oscillator clock signal OSCCLK, as shown in FIG. 10B. That is, the count value is incremented every one period of the oscillator clock signal OSCCLK.

When thus configured counter circuit 130 is used, it suffices that the amount of one-stage delay of the delay circuits 200 to 207 included in the variable delay circuit 21 is determined as twice the amount of delay of the delay circuit 121 included in the oscillator 120.

A second embodiment of the present invention is described next.

Figure 11:
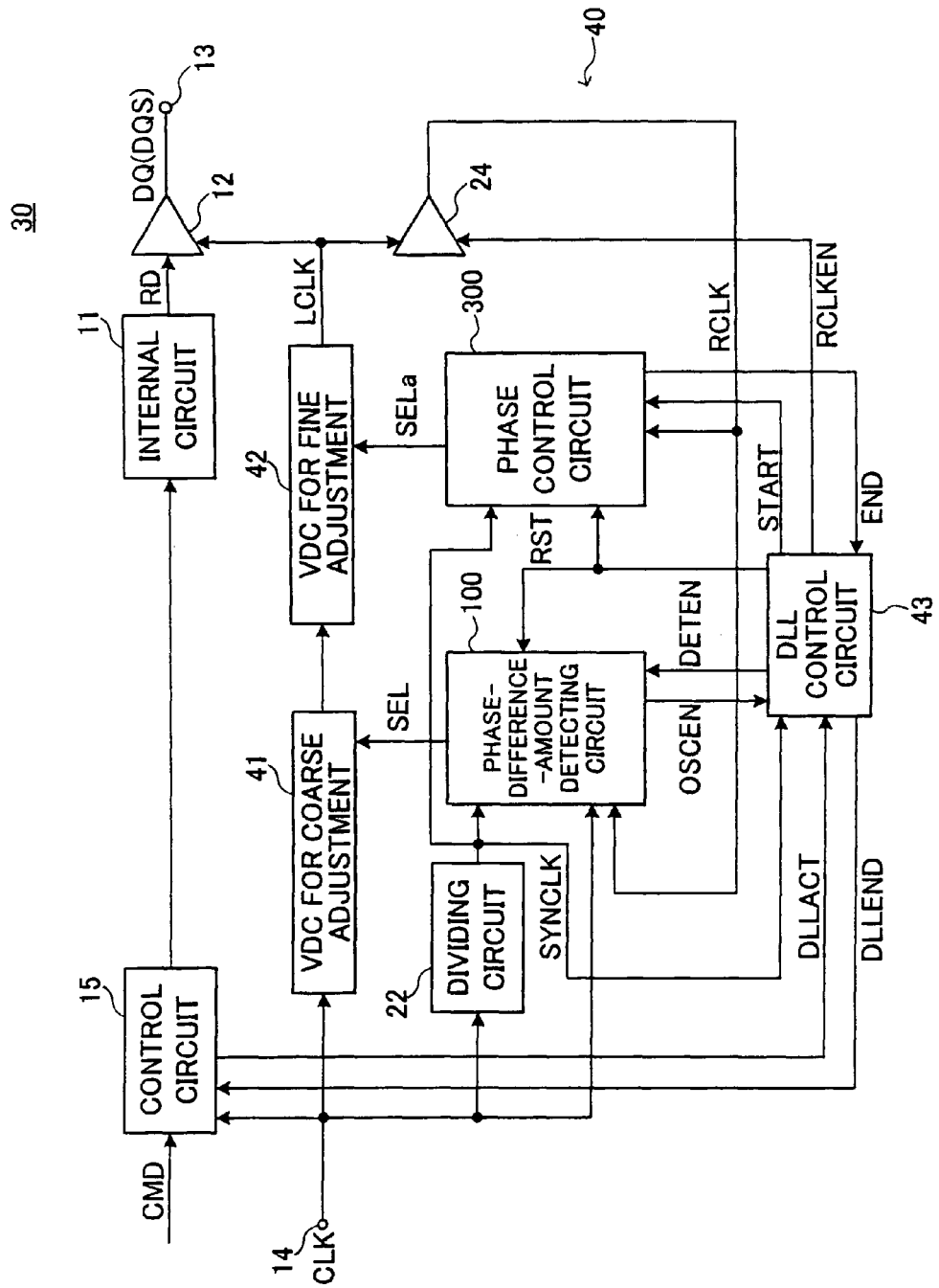
FIG. 11 is a block diagram showing a configuration of a semiconductor device according to the second embodiment of the present invention.

FIG. 11 is a block diagram showing a configuration of a semiconductor device 30 according to the second embodiment of the present invention.

The semiconductor device 30 according to the second embodiment is different from the semiconductor device 10 according to the first embodiment shown in FIG. 1 in that the DLL circuit 20 is replaced by a DLL circuit 40. The DLL circuit 40 is different from the DLL circuit 20 in that two variable delay circuits 41 and 42 are used instead of the variable delay circuit 21, a phase control circuit 300 is added, and a DLL control circuit 43 is used instead of the DLL control circuit 23. Other elements of the DLL circuit 40 are identical to those of the DLL circuit 20 shown in FIG. 1, and thus like reference numerals are denoted to like elements and redundant explanations thereof will be omitted.

As described above, the second embodiment uses the two cascade-connected variable delay circuits 41 and 42. The first one is the variable delay circuit 41 for coarse adjustment connected to an upstream side and has a relatively coarse adjustment pitch. An operation of the variable delay circuit 41 for coarse adjustment is controlled by the phase-difference-amount detecting circuit 100. The configuration and operation of the phase-difference-amount detecting circuit 100 are as described above. The variable delay circuit 41 for coarse adjustment is thus operated by the same manner as that of the first embodiment. The second one is the variable delay circuit 42 for fine adjustment connected to a downstream side and has a relatively fine adjustment pitch. An operation of the variable delay circuit 42 for fine adjustment is controlled by the phase control circuit 300. Unlike the phase-difference-amount detecting circuit 100, the phase control circuit 300 performs 1-pitch phase control by one adjusting operation. Details of the phase control circuit 300 are explained later.

The DLL control circuit 43 controls the phase-difference-amount detecting circuit 100, the phase control circuit 300, and the replica buffer 24 and is operated based on commands from the control circuit 15. Specifically, in addition to the operation of the DLL control circuit 23 used in the first embodiment, when the adjusting operation of the variable delay circuit 41 for coarse adjustment is completed, the DLL control circuit 43 outputs a start signal START to the phase control circuit 300. Further, when an end signal END is inputted by the phase control circuit 300, the DLL control circuit 43 ends a series of the adjusting operation.

Figure 12:
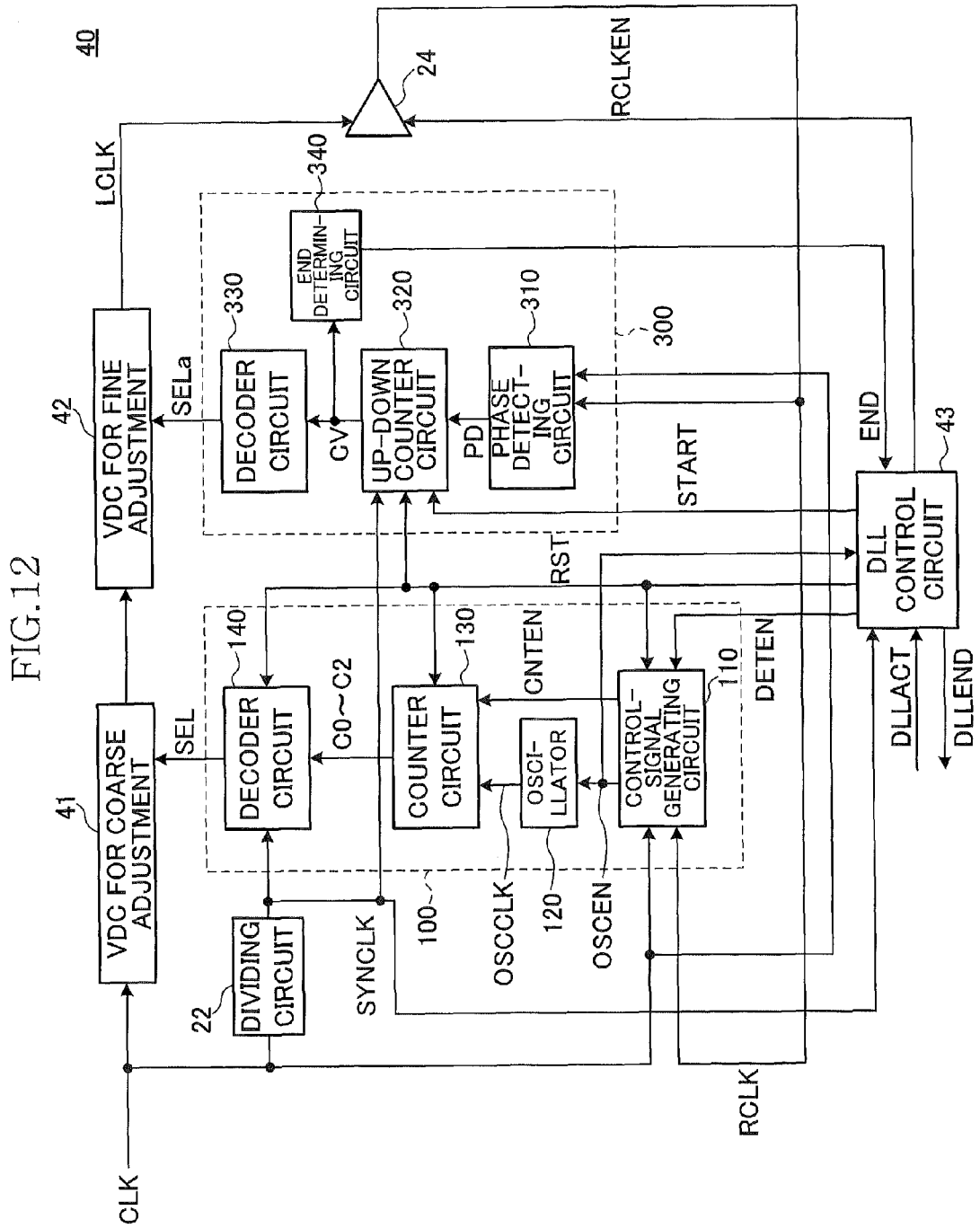
FIG. 12 is a further detailed block diagram of the DLL circuit.

FIG. 12 is a further detailed block diagram of the DLL circuit 40 and shows internal configurations of the phase-difference-amount detecting circuit 100 and the phase control circuit 300 in more detail. Explanations of the phase-difference-amount detecting circuit 100 will be omitted here.

As shown in FIG. 12, the phase control circuit 300 includes a phase detecting circuit 310, an up-down counter circuit 320, a decoder circuit 330, and an end determining circuit 340.

The phase detecting circuit 310 receives the external clock signal CLK and the replica clock signal RCLK to detect their phases. That is, the phase detecting circuit 310 detects whether the phase of the replica clock signal RCLK is advanced or delayed with respect to the external clock signal CLK and, unlike the phase-difference-amount detecting circuit 100, the phase detecting circuit 310 does not detect "the amount of phase difference". A phase detection signal PD serving as a result of detection is supplied to the up-down counter circuit 320.

The up-down counter circuit 320 counts up or down the count value based on the phase detection signal PD. For example, when the phase detection signal PD is a high level, the up-down counter circuit 320 counts up and counts down when the phase detection signal PD is a low level. A counting operation of the up-down counter circuit 320 is permitted when the start signal START supplied by the DLL control circuit is activated. A counting-up or counting-down is in synchronization with the sampling clock signal SYNCLK. The reset signal RST is also supplied to the up-down counter circuit 320. When the reset signal RST is activated, the count value is initialized. A count value CV of the up-down counter circuit 320 is supplied to the decoder circuit 330 and the end determining circuit 340.

The decoder circuit 330 receives and decodes the count value CV of the up-down counter circuit 320 to supply a select signal SELa serving as a result of decoding to the variable delay circuit 42 for fine adjustment. The amount of delay of the variable delay circuit 42 for fine adjustment is thus determined by the count value CV of the up-down counter circuit.

The end determining circuit 340 activates the end signal END when a change in the count value CV indicates a predetermined pattern. The predetermined pattern indicates the change in the count value CV obtained when the DLL circuit 40 is locked. Although a specific pattern is not particularly limited, examples of the pattern include a case that a direction of updating the count value CV is changed (such as a case that counting-down is performed after continuous counting-up) and a case that the direction of updating the count value CV is changed twice continuously (such as a case that counting-down is performed after continuous counting-up and then counting-up is performed). The end signal END is supplied to the DLL control circuit 43 and thus the DLL control circuit 43 can be notified that the DLL circuit 40 is locked.

With this configuration, according to the second embodiment, the delay of the variable delay circuit 42 for fine adjustment is varied by one pitch by one adjusting operation. The phase of the external clock signal CLK can thus match with that of the replica clock signal RCLK more precisely. Further, the amount of delay of the variable delay circuit 42 for fine adjustment is varied by one pitch, because, as one of the reasons therefore, the amount of 1-pitch delay is small in the variable delay circuit 42 for fine adjustment and thus it is difficult to detect the amount of phase difference and control the variable delay circuit 42 for fine adjustment based on the amount of phase difference.

According to the second embodiment, the same circuit as the variable delay circuit 21 shown in FIG. 7 or FIG. 9 can be used as the variable delay circuit 41 for coarse adjustment. Therefore, parts relating to the variable delay circuit 41 for coarse adjustment operate in the same manner as that of the first embodiment.

Figure 13:
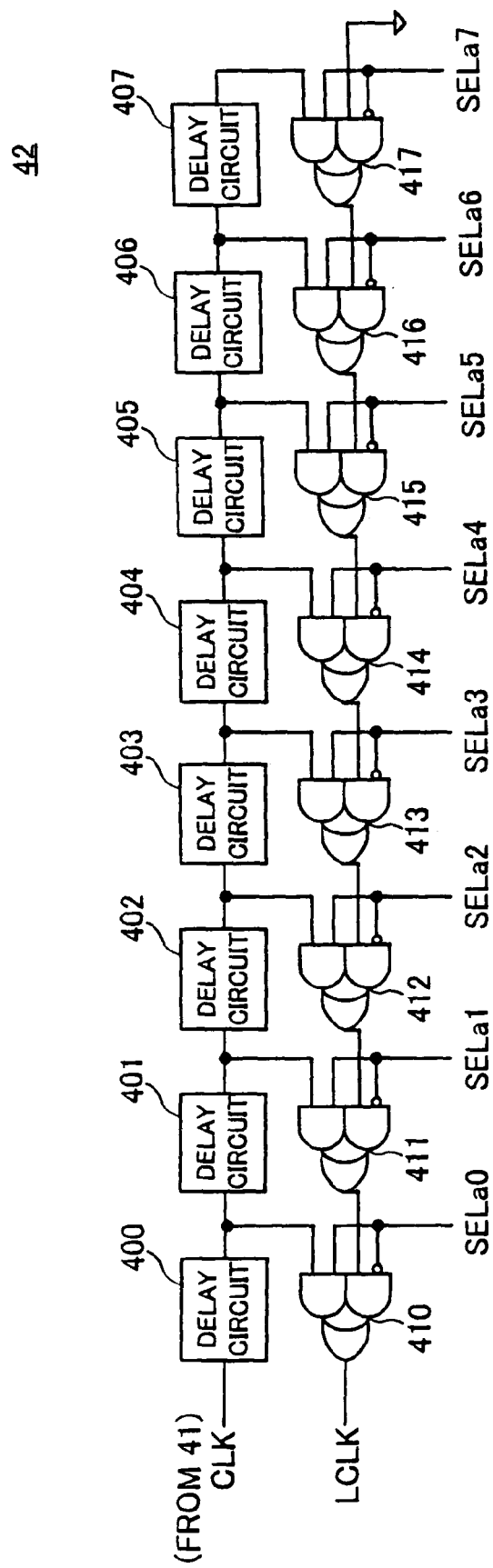
FIG. 13 is a circuit diagram showing an example of the variable delay circuit for fine adjustment.

FIG. 13 is a circuit diagram showing an example of the variable delay circuit 42 for fine adjustment. While the variable delay circuit 42 for fine adjustment shown in FIG. 13 has the same configuration as that of the variable delay circuit 21 shown in FIG. 7 (the variable delay circuit 41 for coarse adjustment), the amount of one-stage delay of delay circuits 400 to 407 is designed to be smaller than the amount of one-stage delay of the delay circuits 200 to 207. Accordingly, its adjustment pitch becomes smaller than that of the variable delay circuit 41 for coarse adjustment and thus finer phase control can be performed.

Figure 14:
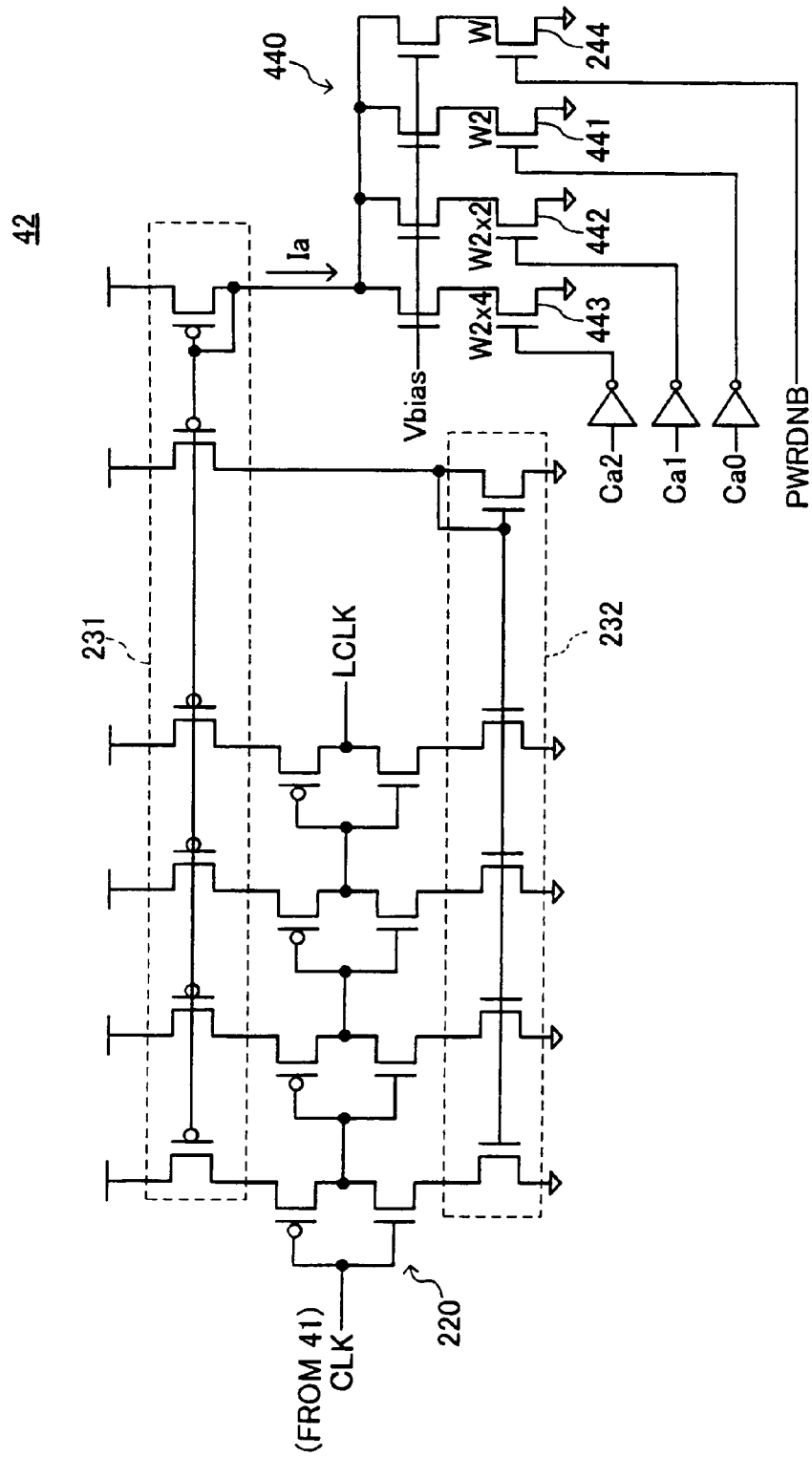
FIG. 14 is a circuit diagram showing another example of the variable delay circuit for fine adjustment.

FIG. 14 is a circuit diagram showing another example of the variable delay circuit 42 for fine adjustment. The variable delay circuit 42 for fine adjustment shown in FIG. 14 has the same configuration as that of the variable delay circuit 21 shown in FIG. 9 (the variable delay circuit 41 for coarse adjustment); however, the channel width of select transistors 441 to 443 constituting a current adjustment circuit 440 is extended from W to W2. Because the adjustment pitch thus becomes smaller than that of the variable delay circuit 41 for coarse adjustment, finer phase control can be performed.

As described above, the DLL circuit 40 according to the second embodiment includes the variable delay circuit 41 for coarse adjustment with a relatively coarse pitch of adjusting the amount of delay and the variable delay circuit 42 for fine adjustment with a relatively fine pitch of adjusting the amount of delay. The variable delay circuit 41 for coarse adjustment is controlled by the phase-difference-amount detecting circuit 100 that varies the amount of delay by one or more pitches by one adjusting operation. The variable delay circuit 42 for fine adjustment is controlled by the phase control circuit 300 that varies the amount of delay by one pitch by one adjusting operation. Thus, the DLL circuit 40 can be locked precisely at a high speed.

A third embodiment of the present invention is described next.

Figure 15:
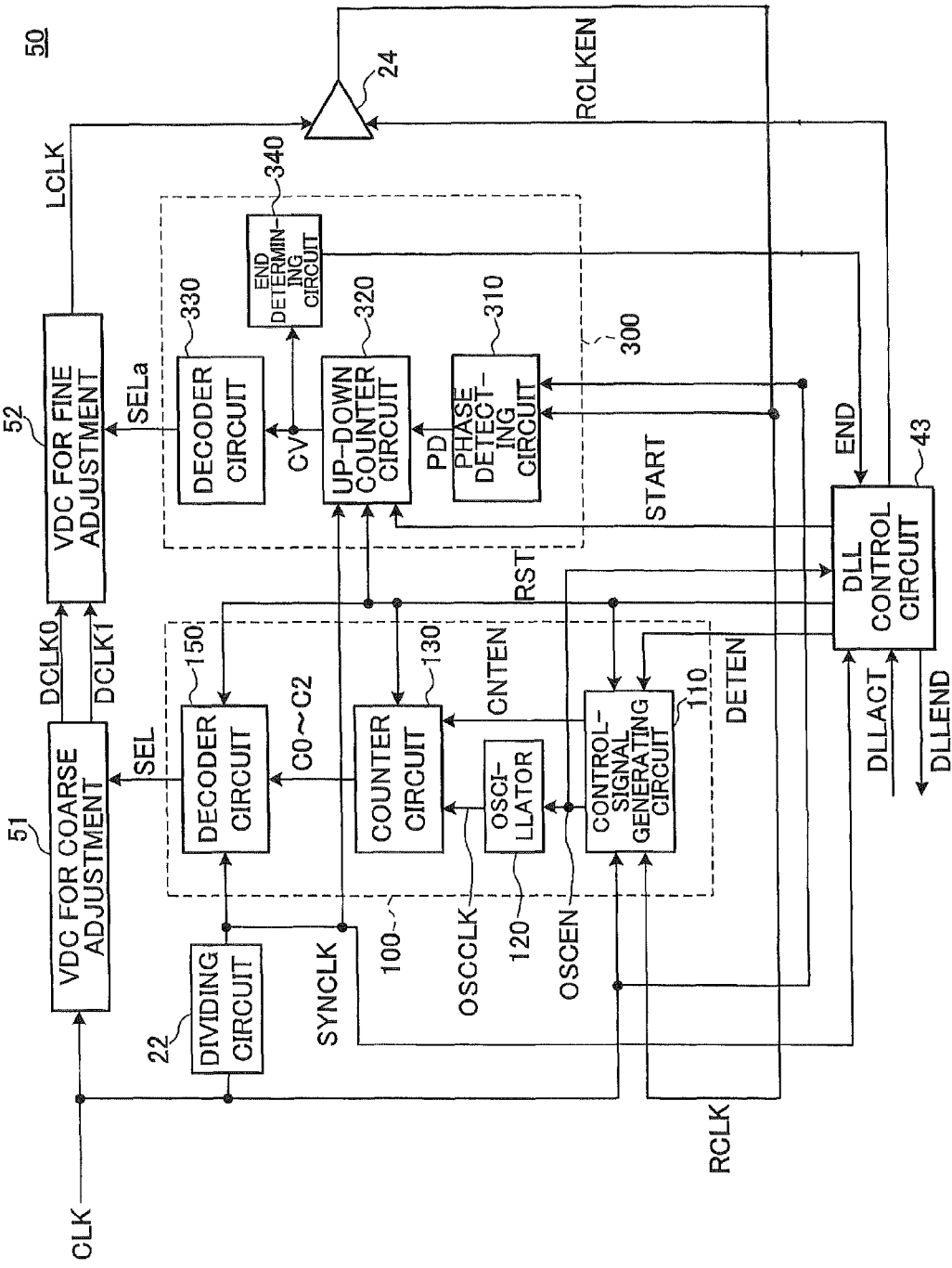
FIG. 15 is a block diagram showing a configuration of a DLL circuit according to the third embodiment of the present invention.

FIG. 15 is a block diagram showing a configuration of a DLL circuit 50 according to the third embodiment of the present invention.

The DLL circuit 50 according to the third embodiment is different from the DLL circuit 40 shown in FIG. 12 in that the variable delay circuits 41 and 42 are replaced by variable delay circuits 51 and 52 and the decoder circuit 140 included in the phase-difference-amount detecting circuit 100 is replaced by a decoder circuit 150. Other elements of the DLL circuit 50 are identical to those of the DLL circuit 40 shown in FIG. 12, and thus like reference numerals are denoted like elements and redundant explanations thereof will be omitted.

Figure 16:
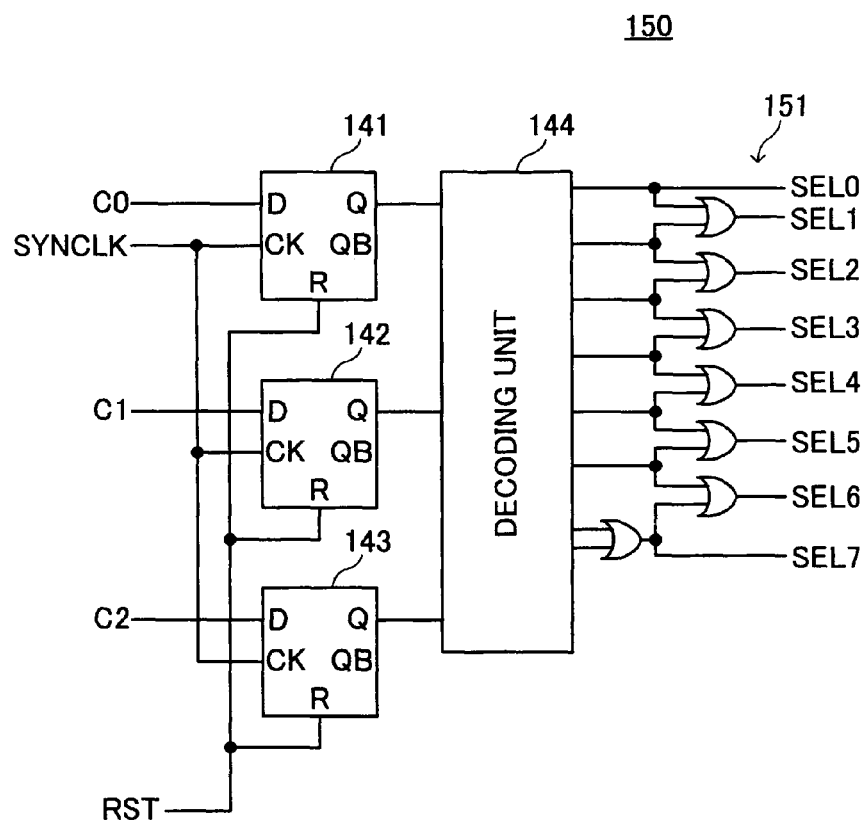
FIG. 16 is a circuit diagram of the decoder circuit.

FIG. 16 is a circuit diagram of the decoder circuit 150. The decoder circuit 150 shown in FIG. 16 is configured such that a logic circuit 151 is added to the downstream of the decoder circuit 140 shown in FIG. 6. Accordingly, not one but two adjacent ones of the select signals SEL0 to SEL7 are activated.

Figure 17:
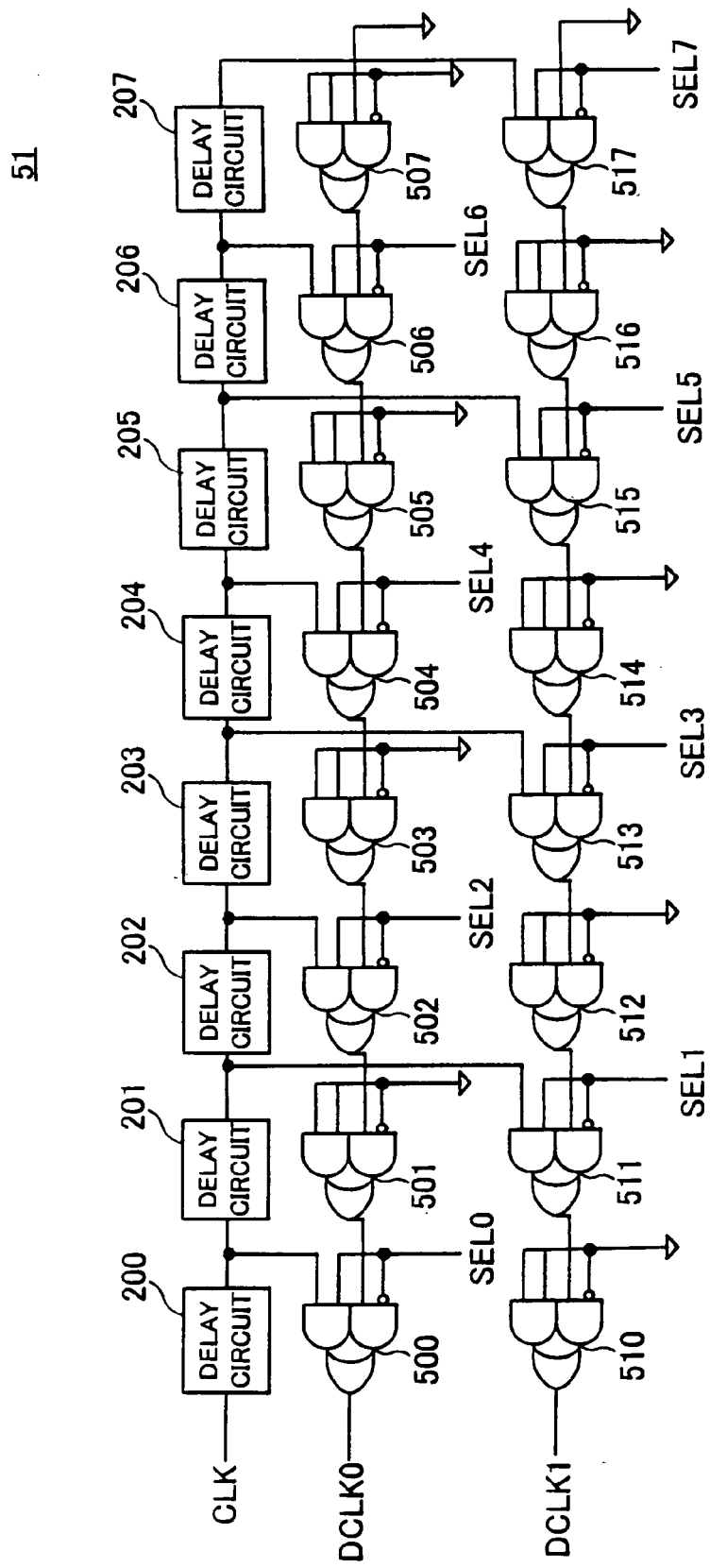
FIG. 17 is a circuit diagram of a variable delay circuit for coarse adjustment.

FIG. 17 is a circuit diagram of a variable delay circuit 51 for coarse adjustment. The variable delay circuit 51 for coarse adjustment shown in FIG. 17 is provided with two systems of composite gates. Specifically, composite gates 500 to 507 are connected to the delay circuits 200, 202, 204, and 206 to which even numbers are allocated and their outputs are outputted as an intermediate clock signal DCLK0. Furthermore, composite gates 510 to 517 are connected to the delay circuits 201, 203, 205, and 207 to which odd numbers are allocated and their outputs are outputted as an intermediate clock signal DCLK1. That is, two intermediate clock signals DCLK0 and DCLK1 are outputted from the variable delay circuit 51 for coarse adjustment. As described above, two adjacent ones of the select signals SEL0 to SEL7 outputted from the decoder circuit 150 are activated at the same time. Accordingly, the phase of the intermediate clock signal DCLK0 are different from that of the intermediate clock signal DCLK1 by one pitch.

Figure 18A:
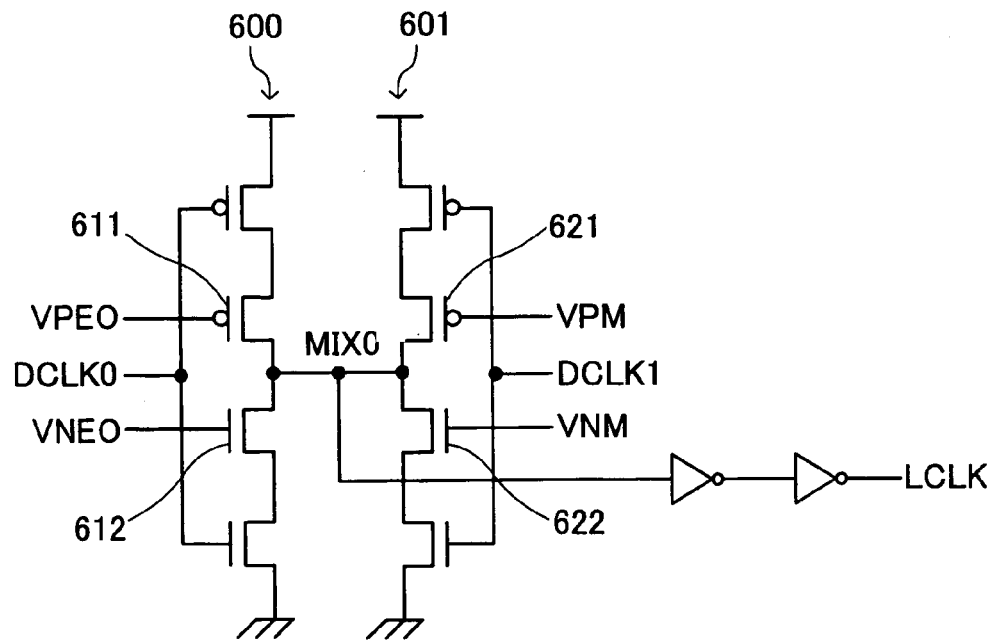
FIG. 18A is a circuit diagram of the variable delay circuit for fine adjustment.
Figure 18B:
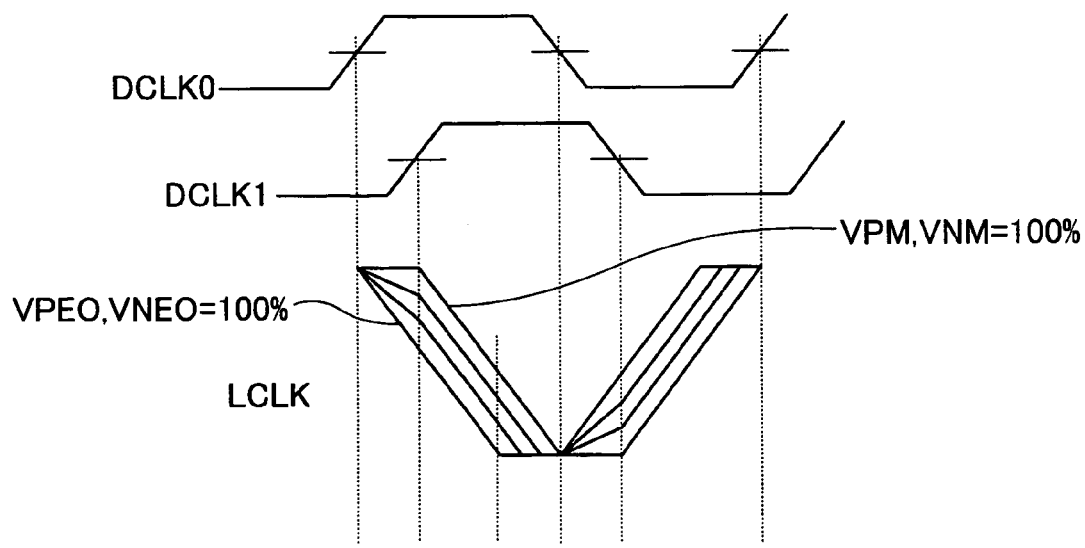
FIG. 18B is a waveform diagram for explaining an operation of the variable delay circuit.

FIG. 18A is a circuit diagram of the variable delay circuit 52 for fine adjustment, and FIG. 18B is a waveform diagram for explaining an operation of the variable delay circuit 52.

The variable delay circuit 52 for fine adjustment shown in FIG. 18A includes an inverter 600 to which the intermediate clock signal DCLK0 is inputted and an inverter 601 to which the intermediate clock signal DCLK1 is inputted and their composite output is used as the internal clock signal LCLK. Transistors 611 and 612 that receive bias voltages VPEO and VNEO, respectively, are directly connected to the inverter 600 and the capability of the inverter 600 is thus adjusted by the bias voltages VPEO and VNEO. Similarly, transistors 621 and 622 that receive bias voltages VPM and VNM, respectively, are directly connected to the inverter 601 and the capability of the inverter 601 is adjusted by the bias voltages VPM and VNM.

With this configuration, a combining ratio of the intermediate clock signals DCLK0 and DCLK1 is determined by a level distribution of these bias voltages as shown in FIG. 18B. For example, when the distribution is determined such that the bias voltages VPEO and VNEO are 100% and the bias voltages VPM and VNM are 0%, the phase of the internal clock signal LCLK to be generated matches substantially with the phase of the intermediate clock signal DCLK0. On the other hand, when the distribution is determined such that the bias voltages VPEO and VNEO are 0% and the bias voltages VPM and VNM are 100%, the phase of the internal clock signal LCLK to be generated matches substantially with the phase of the intermediate clock signal DCLK1. Further, when the distribution is determined such that the bias voltages VPEO and VNEO are 50% and the bias voltages VPM and VNM are also 50%, the phase of the internal clock signal LCLK to be generated is substantially intermediate between phases of the intermediate clock signals DCLK0 and DCLK1.

The two intermediate clock signals DCLK0 and DCLK1 whose phases are different from each other by one pitch can be combined at any ratio, so that fine adjustment of the internal clock signal LCLK is realized. The bias voltage can be generated by D/A converting an output of the decoder circuit 330.

It is apparent that the present invention is not limited to the above embodiments, but may be modified and changed without departing from the scope and spirit of the invention.

While the above embodiments have been described by taking a DRAM having a DLL circuit incorporated therein as an example, the scope that the present invention is applied is not limited to DRAMs, and the present invention can be also applied to semiconductor devices other than memories. Specifically, the invention of the present application can be applied to general semiconductor products having a DLL circuit incorporated therein, such as a CPU (Central Processing Unit), an MCU (Micro Control Unit), a DSP (Digital Signal Processor), an ASIC (Application Specific Integrated Circuit), or an ASSP (Application Specific Standard Circuit).

What is claimed is:

1. A device comprising a DLL circuit that comprises:
a first terminal supplied with a first clock signal;
a second terminal supplied with a second clock signal;
a clock circuit configured to produce a third clock signal in response to an active level of an enable signal supplied thereto and to stop producing the third clock signal in response to an inactive level of the enable signal irrespective of each of the first and second clock signals;
a delay circuit coupled to the first terminal to receive the first clock signal and supplied with delay control data, the delay circuit being configured to delay the first clock signal in repose to the delay control data and produce a fourth clock signal;
a buffer circuit producing the second clock signal in response to the fourth clock signal; and
a control circuit coupled to receive a DLL initiation signal that is generated to activate the DLL circuit while the first clock signal is being supplied to the first terminal, the control circuit being further coupled to the first terminal, the second terminal, the clock circuit and the delay circuit and configured to respond to generation of the DLL initiation signal and change the enable signal from the inactive level to the active level to allow the clock circuit to produce the third clock signal and configured to generate the delay control data in response to the first, second and third clock signals.

2. The device as claimed in claim 1, wherein the third clock signal is greater in frequency than each of the first and second clock signals.

3. The device as claimed in claim 2, wherein the delay circuit comprises a plurality of delay units coupled in cascade, each of the delay units being approximately equal in delay amount to each other, and the third clock signal being related in cycle to the delay amount.

4. The device as claimed in claim 1, wherein the control circuit comprises a counter coupled to the clock circuit to count the third clock signal and a decoder circuit coupled to the counter to generate the delay control data.

5. The device as claimed in claim 4, wherein the counter is activated to count the third clock signal during a time period between one of rising and falling edges of the first clock signal and one of rising and falling edges of the second clock signal that are adjacent to each other.

6. The device as claimed in claim 5, wherein the enable signal is returned from the active level to the inactive level to make the clock circuit stop producing the third clock signal in an interval covering the time period so that the third clock is prevented from being produced in a state where the first and second clock signals are being supplied to the first and second terminals, respectively.

7. The device as claimed in claim 1, wherein the clock circuit comprises an oscillator that is provided separately from each of the first and second terminals so that the oscillator is configured to respond to the active level of the enable signal to start oscillation without being triggered by any of the first and second clock signals.

8. The device as claimed in claim 7, wherein the oscillator comprises a ring oscillator, and the third clock signal is greater in frequency than each of the first and second clock signals.

9. A device comprising:
a first terminal supplied with a first clock signal;

a second terminal supplied with a second clock signal;

a first delay circuit coupled to the first terminal to receive the first clock signal and supplied with first delay control data, the first delay circuit being configured to delay the first clock signal in response to the first delay control data and produce a third clock signal;

a second delay circuit coupled to the first delay circuit to receive the third clock signal and supplied with second delay control data, the second delay circuit being configured to delay the third clock signal in response to the second delay control data and produce a fourth clock signal;

a buffer circuit coupled to receive the fourth clock signal to produce the second clock signal;

a third terminal operatively supplied with a fifth clock signal;

a fourth terminal operatively supplied with a sixth clock signal that is different in frequency from the fifth clock signal;

a first control circuit coupled to the first delay circuit to produce and supply the first delay control data to the first delay circuit in response to the first, second and fifth clock signals; and a second control circuit coupled to the second delay circuit to produce and supply the second delay control data to the second delay circuit in response to the first, second and sixth clock signals.

10. The device as claimed in claim 9, wherein the fifth clock signal is greater in frequency than each of the first, second and sixth clock signals.

11. The device as claim 10, wherein the sixth clock signals is smaller in frequency than each of the first and second clock signals.

12. The device as claimed in claim 9, further comprising:
an oscillator oscillating, when activated, to produce the fifth clock signal that is greater in frequency than each of the first and second clock signals; and
a frequency divider coupled between the first and fourth terminals to frequency-divide the first clock signal to produce the sixth clock signal.

13. The device as claimed in claim 9,
wherein the device further comprises:
an oscillator configured to start oscillation to produce the fifth clock signal in response to an active level of a first enable signal supplied thereto, the oscillator stopping oscillation in response to an inactive level of the enable signal irrespective of each of the first and second clock signals; and a DLL control circuit configured to generate a second enable signal in response to a DLL initiation signal that is generated while the first clock signal is being supplied to the first terminal;
wherein the fifth clock signal is greater in frequency than each of the first, second and sixth clock signals; and
wherein the first control circuit is configured to respond to generation of the second enable signal and change the first enable signal from the inactive level to the active level to allow the oscillator to produce the fifth lock signal.

14. The device as claimed in claim 13, wherein the first control circuit comprises a counter coupled to the oscillator to count the fifth clock signal and a first decoder circuit coupled to the counter to generate the first delay control data.

15. The device as claimed in claim 14, wherein the counter is activated to count the fifth clock signal during a time period between one of rising and falling edges of the first clock signal and one of rising and falling edges of the second clock signal that are adjacent to each other.

16. The device as claimed in claim 15, wherein the first enable signal is returned from the active level to the inactive level to make the oscillator stop oscillation in an interval covering the time period so that the fifth clock is prevented from being produced in a state where the first and second clock signals are being supplied to the first and second terminals, respectively.

17. The device as claimed in claim 14, wherein the second control circuit comprises:
a phase comparison circuit coupled to the first and second terminals to compare in phase between the first and second clock signals;
an up/down counter counting up or down the sixth clock signal in response to an output of the phase comparison circuit; and
a second decoder circuit coupled to the up/down counter to generate the second delay control data.

18. The device as claimed in claim 17, further comprising a frequency divider coupled between the first and fourth terminals to frequency-divide the first clock signal to produce the sixth clock signal.

19. The device as claimed in claim 11, the first delay circuit serves as a coarse delay circuit and the second delay circuit serves as a fine delay circuit.

20. The device as claimed in claim 11, wherein the first clock signal is provided an external clock signal from an outside of the device.

* * * * *